United States Patent [19]

Wilber et al.

[11] 4,313,062
[45] Jan. 26, 1982

[54] BIDIRECTIONAL DEFLECTOR DRIVER FOR VIDEO DISC

[75] Inventors: James A. Wilber; Todd J Christopher, both of Indianapolis, Ind.

[73] Assignee: RCA Corporation, New York, N.Y.

[21] Appl. No.: 95,310

[22] Filed: Nov. 19, 1979

[51] Int. Cl.³ .................................... H03K 17/00
[52] U.S. Cl. .................................... 307/108; 307/261; 328/185; 361/152
[58] Field of Search ............... 307/108, 261, 262, 228; 328/185, 187; 361/152; 360/DIG. 1; 358/128.5

[56] References Cited

U.S. PATENT DOCUMENTS

| | | | |
|---|---|---|---|
| 3,535,555 | 10/1970 | Heimer | 328/185 X |
| 3,648,067 | 3/1972 | Sullivan et al. | 328/185 X |
| 4,064,406 | 12/1977 | Tiemeijer | 307/228 |
| 4,077,015 | 2/1978 | Carson et al. | 331/4 |

Primary Examiner—L. T. Hix
Assistant Examiner—James L. Dwyer
Attorney, Agent, or Firm—E. M. Whitacre; J. S. Tripoli; E. P. Herrmann

[57] ABSTRACT

A bidirectional pulse generator for driving a video disc stylus deflector. Responsive to a deflection pulse a charge integrator has its input connected to a polarity selectable current source. The integrator generates a ramped potential output signal having an amplitude proportional to the deflection pulse width and a slope related to the current polarity. Upon termination of the deflection pulse a feedback loop is closed around the integrator to rapidly reset the output potential of the integrator to one of two pre-pulse output amplitudes. A direction control selects the current source polarity and controls the pre-pulse output amplitude and thereby the relative polarity of the output pulse.

7 Claims, 3 Drawing Figures

BIDIRECTIONAL DEFLECTOR DRIVER FOR VIDEO DISC

This invention relates to pulse generators and in particular to a bidirectional pulse generator. Bidirectional pulse generators of the type described herein have been found to be useful for driving a video disc stylus deflector transducer.

Certain video disc systems employ a track following signal pickup stylus for recovering prerecorded information from a record disc having information bearing tracks proximate the surface thereof. Radial motion of the stylus across the disc is normally maintained at a uniform rate. However, either to correct for an anomolous stylus "skip" (forward or backward) or to produce special effects, (such as stop motion, slow motion, fast forward motion, etc.) it is desirable to have the ability to induce a relatively precise stylus translation upon user or system command, toward the inner or outer record disc extremity. This ability is afforded by stylus deflector or skipper transducers mounted to cooperate with the stylus holding arm. See, for example, U.S. patent application Ser. No. 039,359 filed May 15, 1959 by J. C. Bleazey entitled, "Track Skipper for Video Disc" and assigned to the common assignee with this invention. To operate such transducers a variable pulse amplitude signal is desirably coupled thereto with the capability to reverse the signal polarity to effect controlled stylus translations of varying distances in either direction relative to the present position of the stylus.

The present invention comprises a programmable bidirectional pulse generator subject to control from a deflection pulse of variable width and a direction signal. In response to the amplitude of a bilevel direction signal, the pulse generator assumes one of two quiescent pre-pulse amplitudes. When the next subsequent output pulse is required to be a negative-going pulse the pre-pulse output potential of the generator is pre-conditioned to be near its relatively positive supply potential. Conversely, if the subsequent output pulse is required to be a positive-going pulse the pre-pulse output potential is pre-conditioned near the relatively negative supply potential. Transitions between the two pre-pulse output potentials is controlled by the state of the aforementioned direction signal. Transitions between pre-pulse output levels are isolated from the transducer by virtue of the pulse generator being capacitively coupled to the transducer.

Responsive to a deflection pulse a charge integrator has its input connected to a polarity selectable current source. The charge integrator generates a ramped potential output signal having an amplitude proportional to the deflection pulse duration or width, and a slope determined by the current polarity. At the termination of the deflection pulse a feedback loop is closed around the charge integrator. The feedback loop is responsive to the direction-signal to rapidly reset or establish the pre-pulse output amplitude of the integrator. The ramped output signal from the integrator is applied to energize the stylus deflector.

Figure 1:
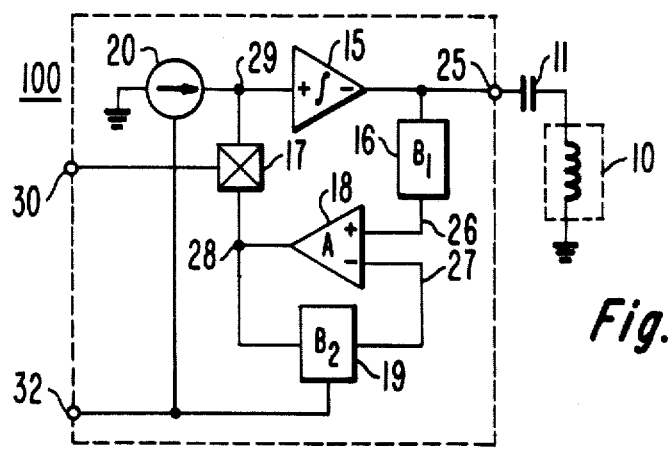
FIG. 1 is a block diagram of a bidirectional pulse generator embodying the present invention.

In FIG. 1 a programmable bidirectional pulse generator 100 is shown coupled via capacitor 11 to drive electromagnetic transducer deflector coil 10. The output signal at terminal 25 is generated by circuit 15 integrating a constant current from source 20 applied to its input terminal 29. The amplitude of the output signal is related to the duration that current is applied to circuit 15 and the relative polarity of the output signal is related to the polarity of the current from source 20.

The bidirectional aspect of the signal coupled to the transducer is provided as follows. In the absence of a deflection pulse, feedback is provided around the integrating circuit 15, which establishes the DC or baseline output potential at one of two levels relatively nearer the positive supply potential if a negative going output pulse is anticipated or relatively nearer the negative supply potential if a positive going output pulse is anticipated. The particular baseline potential is determined by a "direction" pulse applied to terminal 32 which controls both the feedback potential and the polarity of current source 20. Upon reception of a "deflection" pulse applied to terminal 30 the integrating circuit 15 causes the output potential at terminal 25 to slew or ramp from the established baseline and tending toward the opposite supply potential.

The output pulses induced by the deflection pulses have sufficiently fast transitions to be coupled by capacitor 11 to transducer 10. On the other hand, the baseline transitions caused by the direction signals are maintained sufficiently slow to prevent their being coupled to the transducer 10 if the amplitude of the baseline potential change is sufficient to energize the transducer.

Figure 2:
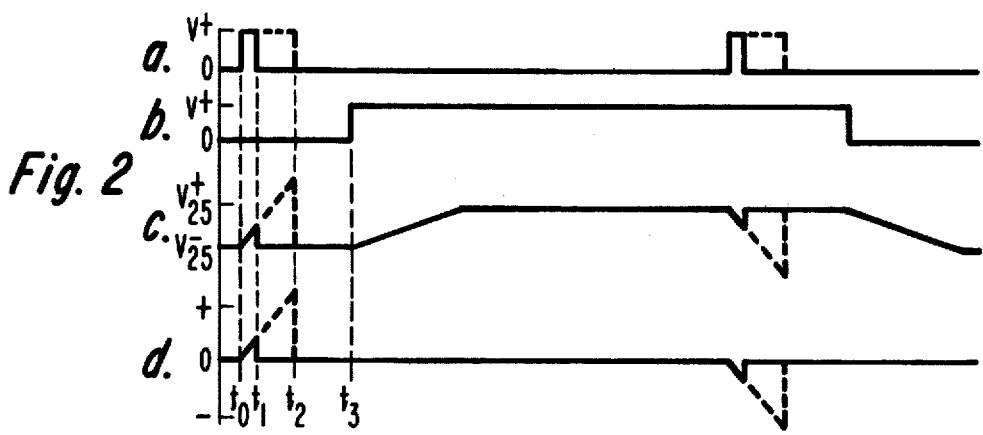
FIG. 2 is a time-voltage waveform diagram for the FIG. 1 circuit.

The FIG. 1 circuit will be described more particularly in conjunction with the waveforms of FIG. 2. Waveform (a) is the stylus deflection command or signal having variable pulse width for determining the amplitude of the pulse generator 100 output pulse and consequently the degree of stylus deflection. Waveform (a) is applied to the control terminal 30 of switch 17 which completes the feedback loop around integrator 15 when it is in the "low" state, and opens switch 17 when it is in the "high" state. Waveform (b) is determinative of the polarity of the pulse generator 100 output pulse by selecting the polarity of current source 20 and the output potential of feedback amplifier 18. With waveform (b) in the "low" and "high" states respectively, source 20 sinks and sources current from node 29.

At time $t_0$ switch 17 opens, conditioning integrator 15 to receive the totality of the current from source 20. A constant current is extracted from node 29 conditioning integrator 15 to generate a positive going output signal (waveform (c)) which approximates a linear ramped signal having a prescribed slope or slew rate. The amplitude of the output signal is dependent on the period of the waveform (a) pulse, being greater for a wide pulse ($t_2$) than for a more narrow pulse ($t_1$). On the negative going edge, at $t_1$ of the waveform (a) pulse, switch 17 closes applying a first reset potential on terminal 29 conditioning the integrator 15 to rapidly reinitialize its output potential to its pre-pulse amplitude. The waveform (c) pulse ($t_0 - t_1$) is coupled via capacitor 11 to energize the stylus deflection coil 10. Stylus deflection appears to commence on the fast or trailing edge of the output pulse. The waveform per se, i.e., the ramp on the leading edge, is incident to the method chosen for programming the output amplitude.

The closing of switch 17 on the trailing edge of the deflection pulse completes a feedback loop inclusive of amplifier 18, potential divider 16 and impedance 19. The output impedance of amplifier 18 is low relative to the output impedance of source 20 and the input impedance of integrator 15, consequently the output signal from amplifier 18 completely overrides the current of source 20. The output potential of amplifier 18 is proportional to the differential sum of the pulse generator output potential at terminal 25 and the direction pulse potential (waveform (b)) applied to terminal 32, that is:

$$V_{28} \approx V_{25}\beta_1(1+\beta_2) - \beta_2 V_{32} \quad (1)$$

where $V_{25}$, $V_{28}$ and $V_{32}$ are respectively the potentials at terminal 25, node 28 and terminal 32, $\beta_1$ is the proportion of potential $V_{25}$ applied to amplifier 18 input terminal 26, and $\beta_2$ is the feedback gain factor of the amplifier 18. The potential $V_{32}$ obtains two distinct amplitudes, e.g., zero and 5 volts. Thus the potential $V_{28}$ obtains one of two substantially constant amplitudes when the feedback loop is closed.

The two output potential amplitudes $V_{28}$ of amplifier 18 are arranged to condition the output potential $V_{25}$ of the integrator 15 to have sufficient dynamic range to accommodate the impending deflection pulse. If a positive going deflection pulse is desired the pre-pulse potential $V_{25}$ is arranged to be at the more negative, $V_{25}^-$, of the two potentials. Conversely, of a negative going deflection pulse is anticipated the pre-pulse potential $V_{25}$ is arranged to be at the more positive, $V_{25}^+$, of the two potentials. Consider that the maximum and minimum realizable potentials at terminal 25 due to supply potentials available are $V_{max}$ and $V_{min}$ respectively. Consider also that the integrator output was consistently reset to one-half the difference $V_{max}$ minus $V_{min}$. Under these conditions the maximum positive or negative going deflection pulses are constrained to one-half the supply potential.

Alternatively, the availability of two selectable reset amplitudes $V_{25}^+$ and $V_{25}^-$ conditions the pulse generator for a positive going output potential excursion of $(V_{max} - V_{25}^-)$ and a negative going output potential excursion of $(V_{25}^+ - V_{min})$. Note that in the limit if $V_{25}^+$ and $V_{25}^-$ respectively equal $V_{max}$ and $V_{min}$ then both the positive and the negative going output excursions swing the full supply potentials. In practice $V_{25}^+$ and $V_{25}^-$ are respectively lesser and greater than $V_{max}$ and $V_{min}$. The values of $V_{25}^+$ and $V_{25}^-$ are chosen so that the difference $V_{25}^+$ and minus $V_{25}^-$ is a minimum to reduce system disturbances upon changing from one reset level $V_{25}^+(V_{25}^-)$ to the other $V_{25}^-(V_{25}^+)$ and to reduce the time required for such change.

A change in the direction pulse (waveform (b)) at $t_3$ initiates a change in the reset or baseline level $V_{25}$ of (waveform (c)). The rate of change of potential between the levels $V_{25}^+$ and $V_{25}^-$ is conditioned by the rate of change of the potential at node 28. The frequency response at node 28 depends upon the time constant of the impedance network 19. Generally, if the potential excursion $(V_{max} - V_{min})$ is less than the threshold value required to induce a stylus deflection by transducer coil 10, the rate of change of potential between the two reset levels is inconsequential. Alternatively, if the potential difference $(V_{25}^+ - V_{25}^-)$ exceeds the threshold value, then the rate of change or slew rate concomitant with the reset amplitude change must be chosen sufficiently long that the signal is ineffectively coupled via capacitor 11 to transducer 10.

The waveform (d) illustrates the signal applied to the transducer 10 by capacitor 11. The deflection pulses can be seen to follow relatively symmetrical excursions in both the positive and negative going directions about a zero reference potential.

Figure 3:
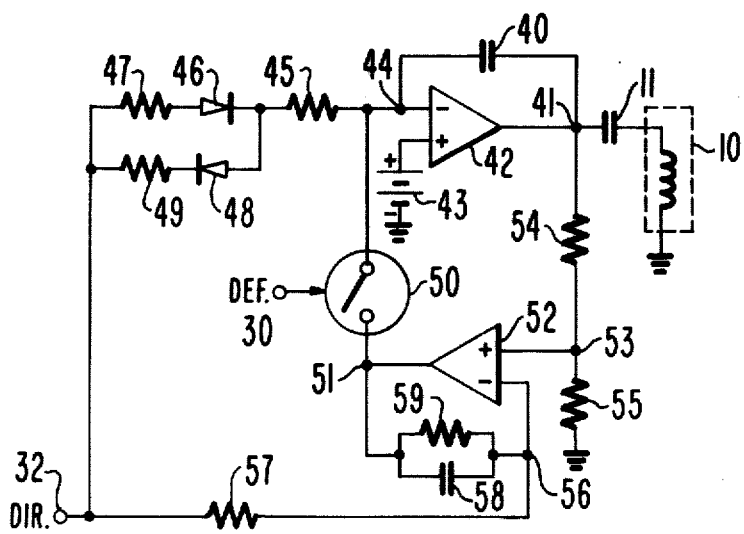
FIG. 3 is a circuit schematic of a particular bidirectional pulse generator embodying the present invention.

The FIG. 3 bidirectional pulse generator is a particular embodiment of the generalized FIG. 1 circuit. Differential amplifier 42 configured with capacitive feedback 40 between its output connection 41 and inverting input connection 44 is a conventional integrating circuit. Constant current applied to connection 44 produces a substantially linear potential ramp at output connection 41. For amplifier 42 having high gain, connection 44 may be assumed to be at AC ground and at a DC potential substantially equal to the reference voltage applied by the battery 43 to the non-inverting input connection. Forward current into connection 44 is supplied from terminal 32 and equal to $(V_{32} - V_D - V_{43})/(R_{47} + R_{45})$ where $V_{32}$, $V_D$ and $V_{43}$ are respectively the potentials at terminal 32, the forward pn potential drop across the diode 46 and the potential of battery 43 and $R_{47}$ and $R_{45}$ are respectively the resistances of resistors 47 and 45. Similarly, the reverse current into connection 44 is equal to $(V_{32} - V_D - V_{43})/(R_{49} + R_{45})$ where $R_{49}$ is the resistance of resistor 49. Diodes 46 and 47 have been included to establish differing forward and reverse impedance levels and thereby differing forward and reverse current levels to produce differing forward and reverse output pulse amplitudes for equal width deflection pulses.

With switch means 50 closed under the control of the deflection signal applied to terminal 30, negative-feedback is applied around integrating amplifier 42. It can be shown that the feedback conditions the non-pulse output amplitude V41 at connection 41 to be:

$$V41 \approx \left(V43 + \frac{R59}{R57}V32\right)\left(\left(\frac{R54}{R55}+1\right) \bigg/ \left(\frac{R59}{R57}+1\right)\right), \quad (2)$$

where V41, V43 and V32 are the potentials at connection 41, reference 43 and terminal 32 respectively and R54, R55, R57 and R59 are the respective resistances of resistor 54, 55, 57 and 59. Choosing R59 equal to R57 equation (2) reduces to $$V41 \approx (V43 + V32)(1 + R54/R55) \quad (3)$$

and it is seen that the two reset or non-pulse potentials are readily established by selection of the reference potential V43 and the ratio of R54:R55.

The capacitor 58 connected between the output and inverting input terminals of amplifier 52 conditions amplifier 52 to integrate abrupt potential changes applied to its input connections and thereby establishes the rate of potential change between reset levels. Switch 50 may be implemented with any conventional electronic or electromechanical switch means having a low series impedance relative to resistors 45, 47 and 49.

What is claimed is:

1. A bidirection pulse generator for a record playback stylus deflection transducer comprising:
   integrator means having an input terminal, an output terminal from which a drive pulse is available, said integrator means generating a signal at its output terminal approximating the integral over-time of a signal applied to its input terminal;

feedback means responsive to the signal from the integrator output terminal and a stylus direction pulse for generating one of a first and second reset conditions;

switch means responsive to a stylus deflection pulse for selectively connecting said feedback means between the integrator input and output terminals; and a current source responsive to the stylus direction pulse for selectively applying current of a first or second polarity to the integrator means input terminal.

2. The bidirectional pulse generator set forth in claim 1 wherein the feedback means comprises:

an amplifier having an inverting input, a non-inverting input and an output terminal;

a divider network connected for applying a portion of the integrator means output signal to the amplifier non-inverting input terminal;

a resistor having a first terminal connected for receiving said stylus direction signal and a second terminal connected to the amplifier inverting input terminal;

a parallel connected resistor-capacitor network connected between the amplifier output and inverting input terminals for establishing the gain of said amplifier and the maximum rate of transition of the reset signal.

3. The bidirectional pulse generator as set forth in claim 1 or 2 wherein the current source comprises:

a first terminal for application of the direction pulse;

first and second resistors each having a first end connected to said first terminal and having respective second ends;

a first unidirectional conduction device having a first end connected to the second end of said first resistor and having a second end;

a second unidirectional conduction device having a first end connected to the second end of said second resistor and having a second end, said first and second unidirectional devices being poled to conduct antiparallel with each other; and means for connecting the second ends of said first and second unidirectional conduction devices to the input terminal of said integrator means.

4. The bidirectional pulse generator set forth in claims 1 or 2 wherein the current source comprises a resistor having a first end arranged for receiving said direction signal and having a second end connected to the input terminal of the integrator means.

5. The bidirectional pulse generator set forth in claims 1 or 2 wherein the integrator means comprises:

an amplifier having an output terminal, a non-inverting input terminal, and an inverting input terminal corresponding to the integrator input terminal;

a reference potential applied to the non-inverting input terminal; and a capacitor having first and second plates respectively connected to the amplifier output and inverting input terminals.

6. In combination:

a signal integrating circuit having an input terminal and an output terminal at which drive signal is available;

a potential divider having an input terminal connected to the integrating circuit output terminal and having an output terminal;

an amplifier having a non-inverting input terminal connected to the output terminal of the potential divider, having an inverting input terminal connected for receiving a first control signal, and having an output terminal;

feedback means connected between the inverting input terminal and the output terminal of the amplifier for establishing both the gain factor and response time of the amplifier output signal, the response time of the amplifier being substantially longer than the response time of the integrating circuit;

switch means responsive to a second control signal for selectively connecting the amplifier output terminal to the integrating circuit input terminal; and a bidirectional current source responsive to the first control signal for selectively applying first and second current amplitudes to the integrating circuit input terminal;

whereby the polarity and the magnitude of the drive signal is controlled in response to the first and second control signals respectively.

7. A bidirectional pulse generator for a record playback stylus deflection transducer system controlled by both a bilevel stylus direction signal and a bilevel stylus deflection signal, said bidirectional pulse generator comprising:

an output terminal;

an inverting amplifier having an output connection connected to said output terminal, and having an input terminal connected for receiving said stylus direction signal;

circuit means having a first terminal connected to the output terminal, a second terminal connected for receiving said stylus direction signal and having a third terminal;

means responsive to a first amplitude level of said stylus deflection signal for selectively connecting the third terminal to the amplifier input terminal enabling said circuit means to provide degenerative feedback, conditioned by said direction signal, around said amplifier to establish the DC potential at the output terminal at one of a first and second output potential and responsive to a second amplitude level of said stylus deflection signal for disconnecting the circuit means from the amplifier input terminal thereby enabling the amplifier to respond to the direction signal applied to said amplifier input terminal, and produce an output potential excursion toward the other of said first and second output potentials.

* * * * *